United States Patent
Kusaka (10) Patent No.: US 12,429,779 B2
(45) Date of Patent: Sep. 30, 2025

(54) LITHOGRAPHY INFORMATION PROCESSING APPARATUS, LITHOGRAPHY SYSTEM, STORAGE MEDIUM, LITHOGRAPHY INFORMATION PROCESSING METHOD, AND ARTICLE MANUFACTURING METHOD

(71) Applicant: CANON KABUSHIKI KAISHA, Tokyo (JP)

(72) Inventor: Atsushi Kusaka, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 275 days.

(21) Appl. No.: 18/187,082

(22) Filed: Mar. 21, 2023

(65) Prior Publication Data

US 2023/0341782 A1 Oct. 26, 2023

(30) Foreign Application Priority Data

Apr. 26, 2022 (JP) .................................. 2022-072579

(51) Int. Cl.
   *G03F 7/00* (2006.01)
(52) U.S. Cl.
   CPC ................................ *G03F 7/70433* (2013.01)
(58) Field of Classification Search
   CPC ............... G03F 7/70433; G03F 7/0002; G03F 7/70608; G03F 9/7073; G06T 2007/30148
   See application file for complete search history.

(56) References Cited

U.S. PATENT DOCUMENTS

| | | | |
|---|---|---|---|
| 2004/0217288 A1* | 11/2004 | Sasajima | G01N 23/225 382/145 |
| 2020/0026202 A1* | 1/2020 | Takakura | G03F 7/7045 |
| 2022/0187810 A1* | 6/2022 | Matsumoto | G05B 19/41875 |

FOREIGN PATENT DOCUMENTS

JP 2021197371 A 12/2021

OTHER PUBLICATIONS

Translation of JP 2021197371, Dec. 27, 2021.*

* cited by examiner

*Primary Examiner* — Peter B Kim (74) *Attorney, Agent, or Firm* — ROSSI, KIMMS & McDOWELL LLP (57) ABSTRACT

In order to provide a lithography information processing apparatus that can optimize, for example, adjustment of alignment at an outer circumferential part of a substrate, the lithography information processing apparatus includes a display control unit that causes a layout of a shot region of the substrate used in a lithography apparatus to be displayed and causes a position of an effective chip in each of the shot regions to be displayed according to the number of chips included in each of the shot regions.

17 Claims, 8 Drawing Sheets

FIG. 8A SUBSTRATE MAP DISPLAY

FIG. 8B SHOT REGION DISPLAY

LITHOGRAPHY INFORMATION PROCESSING APPARATUS, LITHOGRAPHY SYSTEM, STORAGE MEDIUM, LITHOGRAPHY INFORMATION PROCESSING METHOD, AND ARTICLE MANUFACTURING METHOD

BACKGROUND OF THE INVENTION

Field of the Invention

The present invention relates to a lithography information processing apparatus, a lithography system, a storage medium, a lithography information processing method, and an article manufacturing method.

Description of the Related Art

Semiconductor exposure equipment is an apparatus that transfers the pattern drawn on an original plate such as a reticle or a mask onto a substrate. A pattern drawn on an original plate may normally include multiple semiconductor device chips, and multiple semiconductor devices are manufactured from one shot region in the transfer process. Particularly, there are a region in which a chip can be acquired (effective chip region) and a region in which a chip cannot be acquired in an imperfect shot region in the outer circumferential part of the substrate, and it is desirable that exposure conditions be optimized only in the region in which a chip can be acquired.

For example, Japanese Patent Application Laid-Open No. 2021-197371 discloses a configuration in which a layout of an imprint region, classification information, and the like are displayed. However, in the configuration disclosed in Japanese Patent Application Laid-Open No. 2021-197371 and semiconductor exposure equipment of the related art, settings (a recipe) of exposure conditions are made in units of shots, and chip regions within a shot region are not displayed in display of the settings.

For this reason, in order to make a recipe setting in consideration of effective chip regions particularly in an imperfect shot region in which a part of an imprint region at a peripheral portion of the substrate is missing, a lot of time for work of referring to information of other effective chip regions and the like is required.

Therefore, the present invention has as one of objectives to provide a lithography information processing apparatus that can optimize, for example, adjustment of alignment at the outer circumferential part of a substrate.

SUMMARY OF THE INVENTION

In order to achieve the above-described objective, a lithography information processing apparatus according to one aspect of the present invention includes at least one processor or circuit configured to function as a display control unit that causes a layout of a shot region of a substrate used in a lithography apparatus to be displayed and causes a position of an effective chip in each of the shot regions to be displayed according to the number of chips included in each of the shot regions.

Further features of the present invention will become apparent from the following description of embodiments with reference to the attached drawings.

DESCRIPTION OF THE EMBODIMENTS

Hereinafter, with reference to the accompanying drawings, favorable modes of the present invention will be described using Embodiments. In each diagram, the same reference signs are applied to the same members or elements, and duplicate description will be omitted or simplified.

Figure 1:
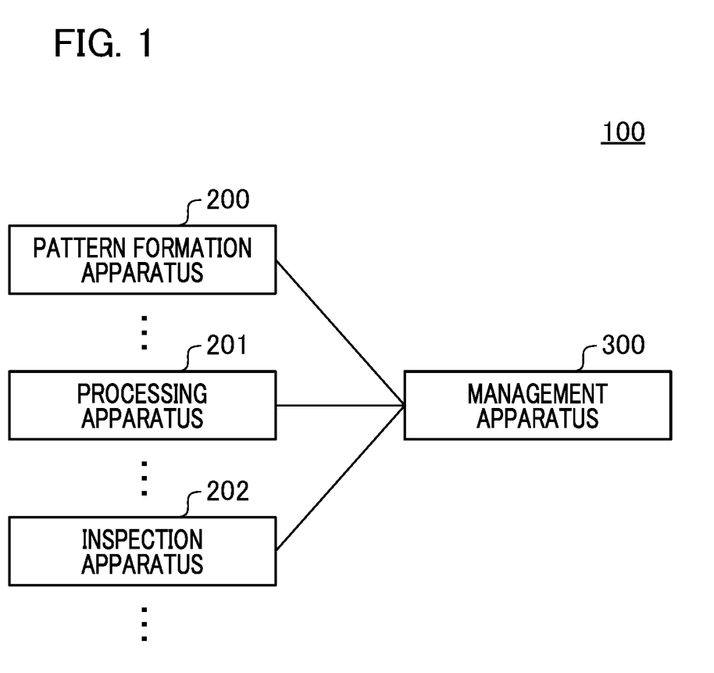
FIG. 1 is a diagram illustrating an article manufacturing system according to an embodiment of the present invention.

An article manufacturing system constituted by a plurality of devices and a management apparatus that manages the plurality of devices according to an embodiment of the present invention will be described. FIG. 1 is a diagram illustrating an article manufacturing system according to an embodiment of the present invention.

The article manufacturing system 100 of the present embodiment includes a pattern formation apparatus 200 that forms patterns on wafers (substrates), a processing apparatus 201, an inspection apparatus 202, and a management apparatus 300 as a lithography information processing apparatus that manages the aforementioned apparatuses. Further, the management apparatus 300 is a remote console and is connected to the pattern formation apparatus 200, the processing apparatus 201, the inspection apparatus 202, and the like through a network.

In addition, the pattern formation apparatus 200, the processing apparatus 201, the inspection apparatus 202 include one or more devices, respectively, in the article manufacturing system 100. Further, the pattern formation apparatus 200 functions as a lithography apparatus (lithography system).

The pattern formation apparatus 200 as a lithography apparatus has an exposure device that radiates light to the pattern part of a reticle (a mask or an original plate), or the like, on which a pattern is formed and projects a pattern of the light from the reticle onto a shot region on the wafer.

In addition, the pattern formation apparatus 200 includes an imprinting device that brings an imprint material supplied on the wafer in contact with the pattern part of the mold (original plate) and applies curing energy to the imprint material to form a composition on which the shape of the mold is transferred.

In addition, the pattern formation apparatus 200 has a drawing device that draws patterns on the substrate using charged particle beams such as electron beams or ion beams through a charge particle optical system to form the pattern on the substrate. The pattern formation apparatus 200 processes the substrate using these methods.

The processing apparatus 201 also includes manufacturing devices that perform steps other than the step performed by the exposure device and the like in manufacturing articles such as devices, and the like, for example, a coating device that coats the surface of the substrate with a photosensitive medium, or the like, a developing device that performs a developing step of developing the substrate on which patterns are formed, and the like. In addition, the processing apparatus 201 includes an etching device, a deposition device, and the like.

The inspection apparatus 202 includes, for example, an overlay inspection device, a line width inspection device, a pattern inspection device, an electrical properties inspection device, and the like. Here, the overlay inspection device is a device that inspects accuracy in misalignment between a pattern of an upper layer and a pattern of a lower layer on a substrate in which patterns are formed in multiple layers.

In addition, the line width inspection device is a device that inspects accuracy in the sizes of line widths of patterns formed on a substrate. In addition, the pattern inspection device is a device that inspects whether there is a pattern not having accuracy due to foreign matters adhering to a substrate on which patterns are formed, imprint material being unfilled, or the like. In addition, the electrical property inspection device is a device that inspects accuracy in electrical properties of semiconductor devices and the like manufactured from a substrate on which patterns are formed.

Next, an overview of an imprinting device as an example of the pattern formation apparatus 200 serving as a lithography apparatus will be described. The imprinting device is a device that brings an imprint material supplied onto a substrate in contact with a mold and applies energy for curing to the imprint material to form a pattern of the cured material to which uneven patterns of the mold have been transferred.

For the imprint material, a curable composition that is cured when energy for curing is applied (also referred to as an uncured resin) is used. Electromagnetic waves, heat, and the like may be used as the energy for curing. Electromagnetic waves can be light whose wavelengths are selected from the range of 10 nm to 1 mm, for example, infrared rays, visible light rays, ultraviolet rays, and the like. The curable composition is a composition that is cured due to light irradiation or heating.

Among such compositions, photocurable compositions that are cured due to light irradiation may contain at least a polymerizable compound and a photopolymerization initiator, and may further contain a non-polymerizable compound or a solvent if necessary. A non-polymerizable compound is at least one kind selected from the group of sensitizers, hydrogen donors, internal demolding agents, surfactants, antioxidants, polymer components, and the like.

The imprint material may be disposed on the substrate in the form of droplets or islands or films formed by connecting a plurality of droplets by an imprint material supply device.

A viscosity of the imprint material (viscosity at 25° C.) is, for example, equal to or higher than 1 m Pa·s and equal to or lower than 100 m Pa·s. Glass, a ceramic, a metal, a semiconductor, a resin, or the like, for example, can be used as a material for the substrate. A member formed of a different material from that of the substrate may be provided on the surface of the substrate, if necessary. The substrate is, for example, a silicon wafer, a compound semiconductor wafer, or quartz glass.

Figure 2:
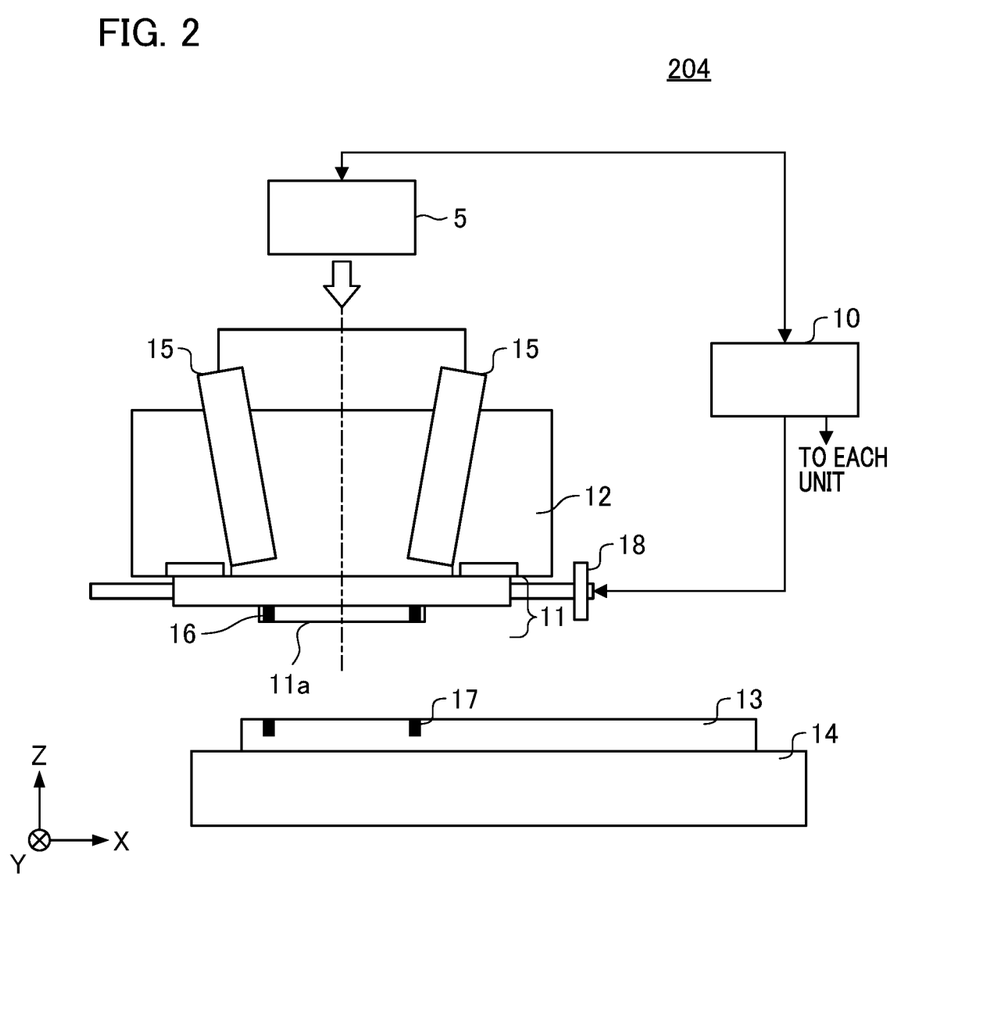
FIG. 2 is a schematic diagram illustrating a configuration of an imprinting device 204 according to an embodiment.

FIG. 2 is a schematic diagram illustrating a configuration of the imprinting device 204 according to an embodiment. The imprinting device 204 performs a series of imprinting processes of curing an imprint material on a substrate while the imprint material is in contact with a mold, separating the mold from the cured imprint material (demolding), and thereby forming patterns on the substrate.

It is assumed in the present embodiment that a light curing method of curing the imprint material through irradiation of ultraviolet rays is employed as an imprint material curing method. Further, the present embodiment will be described assuming that an X axis and Y axis are set in the directions orthogonal to each other within a plane parallel to the surface of the substrate and a Z axis is set in a direction orthogonal to the X and Y axes.

The imprinting device 204 includes a control unit 10, a mold holding unit 12 that holds a mold 11, a substrate stage 14 (substrate holding unit) that holds and moves a substrate 13, a detection unit 15 for detecting misalignment between the mold and the substrate, a radiation unit 5, a dispenser 18, and the like. In addition, the imprinting device 204 also includes a support that supports the dispenser, the mold holding unit 12, and the like, a base surface plate that supports the substrate stage 14, and the like (all of which are not illustrated).

The mold 11 has, for example, a rectangular external shape when it is viewed from the Z axis direction and has a pattern surface 11a on which patterns (uneven patterns) to be transferred onto the imprint material on the substrate 13 are formed. The mold 11 is formed of a material that can transmit ultraviolet rays for curing the imprint material coated on the substrate 13 by the dispenser 18, for example, quartz, or the like. In addition, mold-side marks 16 (first marks) are formed on the pattern surface 11a of the mold 11.

The mold holding unit 12 can include, for example, a mold chuck for vacuum adsorption or electrostatic adsorption of the mold 11, a mold stage on which the mold chuck is placed, and a drive system that drives the mold stage. This drive system drives the mold stage (i.e., the mold 11) at least in the Z axis direction (in which the mold 11 is brought in contact with or separated from the imprint material on the substrate).

In addition, the drive system may further include a function of driving the mold stage in the X axis direction, Y axis direction, and θx (rotation around the X axis), θy (rotation around the Y axis), and θz (rotation around the Z axis) directions.

The substrate 13 is a substrate to which the pattern of the mold 11 is transferred, and can be, for example, a single crystal silicon substrate, a silicon-on-insulator (SOI) substrate, or the like. The imprint material is supplied (coated) from the dispenser 18 onto the substrate 13. In addition, substrate-side marks 17 (second marks) are formed in each of a plurality of shot regions of the substrate 13.

The substrate stage 14 can include, for example, a substrate chuck for vacuum adsorption or electrostatic adsorption of the substrate 13, a drive system that drives the substrate chuck, and a measurement system that measure a position of the stage, such as an encoder. This drive system drives the substrate stage 14 (i.e., the substrate 13) at least in the X axis direction, Y axis direction, and θz direction. In addition, the drive system may further include a function of driving the substrate stage in the z axis direction, θx direction, and θz direction.

The radiation unit 5 (curing unit) radiates light (ultraviolet light) to the imprint material through the mold 11 to cure the imprint material on the substrate 13. The control unit 10 includes, for example, a CPU as a computer and a memory as a storage medium and controls operations of each unit of the imprinting device 204, and controls alignment between the mold and the substrate and controls the radiation unit 5.

The detection unit 15 includes a scope that optically detects (observes) the mold-side marks 16 provided in the mold 11 and the substrate-side marks 17 provided in each of the plurality of shot regions of the substrate 13. The scope may detect each image of the mold-side marks 16 and the substrate-side marks 17, or may detect moire fringes generated due to the mold-side marks 16 and the substrate-side marks 17, or the like. The scope includes an image sensor that converts light from the mold-side marks 16 and the substrate-side marks 17 into electrical signals.

The control unit 10 can calculate relative misalignment between the mold 11 and the substrate 13 by processing images of the detection result by the scope. Further, the scope may not be able to simultaneously detect the mold-side marks 16 and the substrate-side marks 17. For example, the control unit 10 may obtain the position of each of the mold-side marks 16 and the substrate-side marks 17 with respect to the reference position disposed inside the detection unit 15 to calculate a relative positional relationship between the mold-side marks 16 and the substrate-side marks 17.

Next, an overview of an imprinting process by the imprinting device 204 will be described. First, the substrate stage 14 moves to the replacement position of the substrate 13, and the substrate 13 is mounted on the substrate chuck of the substrate stage 14 by a substrate replacement hand, which is not illustrated.

The control unit 10 causes the substrate stage 14 to move such that a shot region which is a target region on the substrate 13 subject to the imprinting process is positioned under the dispenser 18, and causes the dispenser 18 to supply the imprint material onto the shot region of the substrate 13.

Next, after moving the substrate stage 14 such that the shot region is positioned under the mold 11, the control unit 10 causes the mold holding unit 12 to lower the mold 11 and the imprint material on the substrate to come in contact with the pattern surface 11a of the mold 11. The gap between the mold 11 and the substrate 13 becomes, for example, 1 μm or smaller due to the contact, and the gap is filled with the imprint material.

In the initial stage of this contact, misalignment normally occurs between the mold 11 and the substrate 13 in their relative positions in a horizontal direction (the X axis direction and the Y axis direction). The detection unit 15 can detect this misalignment as described above, and the control unit 10 can control alignment drive (alignment) of the substrate stage 14 to eliminate the misalignment.

After alignment is completed, the radiation unit 5 radiates ultraviolet rays to the imprint material to cure the imprint material. After the imprint material is cured, the mold holding unit 12 is raised to separate the mold 11 from the imprint material (demolding), and thereby the imprinting process for one shot region is completed. Thereafter, the sequence of supply of the imprint material onto the substrate, contact of the mold with the imprint material, alignment, curing of the imprint material, and demolding is repeatedly performed for each shot region.

When the imprinting process is finished for the entire surface of the substrate, the substrate stage 14 is moved to the substrate replacing position, and the imprinting-completed substrate 13 is collected by the substrate replacing hand. Then, the next substrate to be processed is placed on the substrate chuck, and the imprinting sequence is performed again on the entire surface of the substrate.

The outline of the imprinting process according to the present embodiment is as described above. Further, although the substrate stage 14 is configured to be moved by using the substrate drive unit, which is not illustrated, at the time of alignment of the mold 11 and the substrate 13 in the above-described example, the mold holding unit 12 may be moved in the X or Y direction. Alternatively, both the substrate stage 14 and the mold holding unit 12 may be configured to be moved.

However, it is assumed in the following description that the substrate stage 14 is moved by using the substrate drive unit at the time of alignment between the mold 11 and the substrate 13. Further, for an alignment mark to be used in alignment between the mold 11 and the substrate 13, an alignment mark selected by a selection unit of a lithography information processing apparatus is used, as will be described below.

Figure 3:
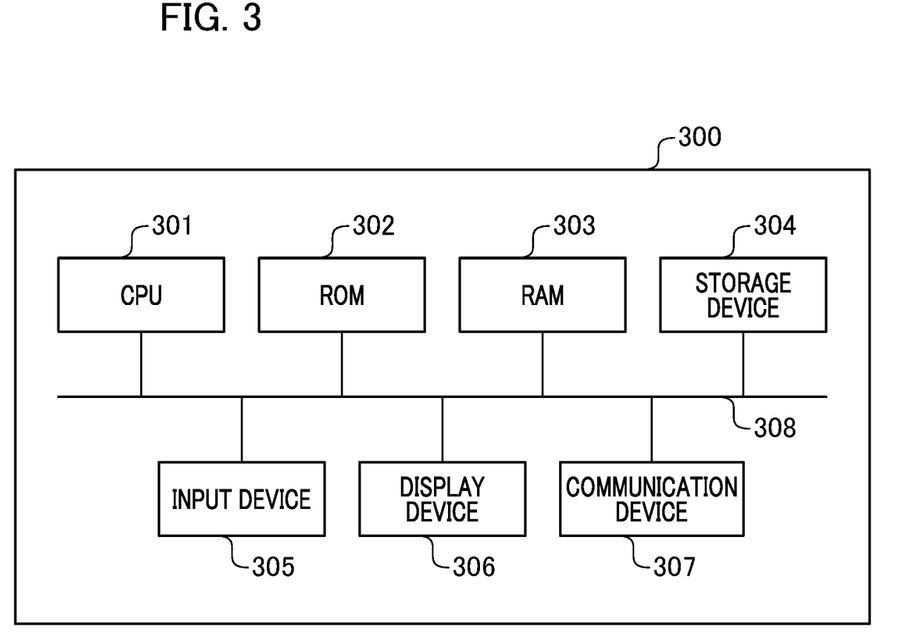
FIG. 3 is a block diagram illustrating a hardware configuration of a management apparatus 300 as an information processing apparatus according to an embodiment.

Next, the management apparatus 300 as an information processing apparatus will be described. FIG. 3 is a block diagram illustrating a hardware configuration of the management apparatus 300 as an information processing apparatus according to an embodiment. The management apparatus 300 includes a CPU 301 as a computer, a ROM 302, a RAM 303, a storage device 304, an input device 305, a display device 306, a communication device 307, and the like.

Each hardware configuration of the management apparatus 300 functions according to, for example, a computer program stored in the storage device 304. In the example of FIG. 3, the CPU 301 performs computations for control in accordance with the computer program to control each of constituent elements connected to a bus 308.

The ROM 302 is a memory dedicated to data reading and stores programs and data. The RAM 303 is a memory for data reading and writing and is used to store programs and data.

The RAM 303 is used to temporarily store data such as results of computations of the CPU 301. The storage device 304 is also used for storing programs and data. The storage device 304 is used as a temporary storage area of programs of the operating system (OS) of the information processing apparatus and data.

The storage device 304 can store a large amount of data although it is slower in input and output of data compared to the RAM 303. The storage device 304 is desirably a non-volatile storage device that can store data to be stored as permanent data in order to refer to the data for a long period of time. Although the storage device 304 is configured as, for example, an SDD or HDD, it may be a device that reads and writes data by loading an external medium such as a CD, a DVD, or a memory card therein.

The input device 305 is a device for inputting characters and data into the management apparatus 300 and corresponds to various kinds of keyboards, mouses, and the like. The display device 306 is a device that plays a role as a user interface of the management apparatus 300 and displays information and processing results necessary for operations of the information processing apparatus and corresponds to a liquid crystal monitor, or the like.

The display device 306 also plays the role of the input device 305 in a case in which it enables operations when the screen is touched, like, for example, a touch panel. Further, although the input device 305 and the display device 306 have been described as a part of the management apparatus 300, the devices may be separate devices, or may be connected to the pattern formation apparatus 200, for example.

The communication device 307 performs data communication according to a communication protocol such as TCP/IP by connecting to a network and is used to communicate with another device. In addition, a GPU (an abbreviation to graphics processor unit) may be included in the management apparatus 300 serving as an information processing apparatus in order to enable high-speed arithmetic processing. The management apparatus 300 can connect to a plurality of imprinting devices 204 via the communication device 307 for data communication.

Figure 4:
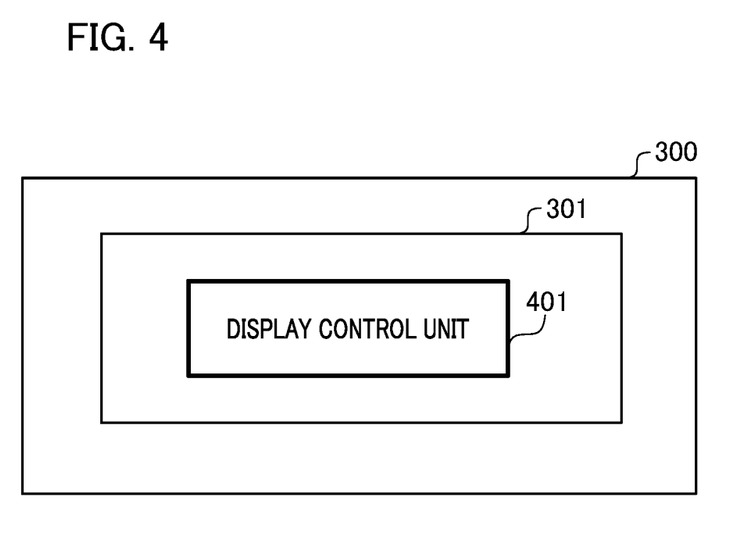
FIG. 4 is a diagram illustrating a configuration of a CPU 301 of the management apparatus 300.

FIG. 4 is a diagram illustrating a configuration of the CPU 301 of the management apparatus 300. The CPU 301 includes a display control unit 401 as a display control unit for controlling display of the display device 306. Further, the display control unit 401 is realized by causing the CPU as a computer to execute a computer program stored in a memory as a storage medium.

However, the display control unit 401 may be realized as hardware partly or entirely. A dedicated circuit (ASIC), a processor (reconfigurable processor or DSP), or the like can be used for the hardware.

Figure 5:
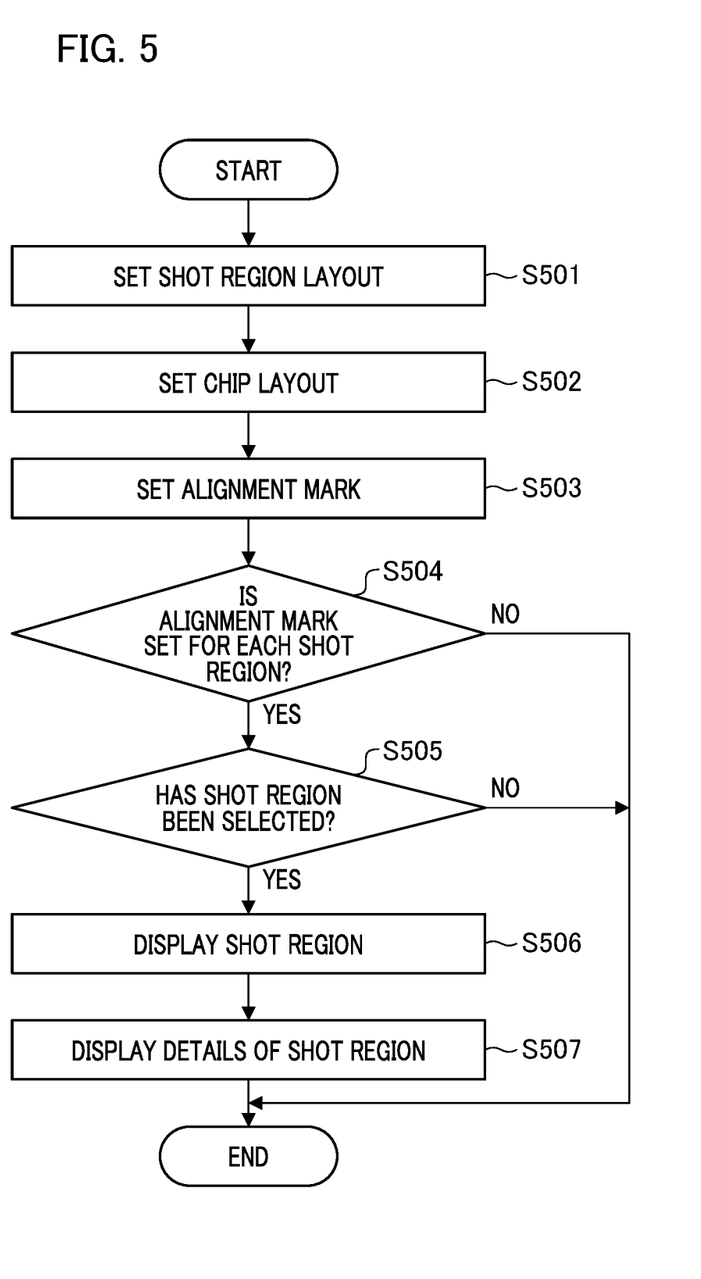
FIG. 5 is a flowchart showing a user interface display process for setting a recipe of an exposure device according to an embodiment.

FIG. 5 is a flowchart showing a user interface display process for setting a recipe of the exposure device according to an embodiment. Further, the operation of each step of the flowchart of FIG. 5 is performed by the CPU 301 as a computer included in the management apparatus 300 executing a computer program stored in the storage device 304 as a storage medium, for example.

Display of the display device 306 by the display control unit 401 of the management apparatus 300 according to the present embodiment will be described with reference to FIGS. 4 and 5. In the present embodiment, the time required for a recipe setting for the imprinting device 204 can be shortened through display of the display device 306 by the display control unit 401. The recipe setting according to the present embodiment includes setting exposure conditions and the like for each individual shot region.

In step S501 of the flowchart of FIG. 5, the display control unit 401 causes information about setting of a shot region layout in the recipe setting of the imprinting device 204 to be displayed. In other words, the layout of each shot region of the substrate to be used in the lithography apparatus is displayed.

The setting of the shot region layout includes, substrate external dimension information, substrate external dimension error information, a step size of shot regions (vertical and horizontal lengths), zero offset for the substrate, the width of an ineffective region of the substrate outer circumferential part, the presence/absence of an imperfect shot region in the substrate outer circumferential part, and the like.

Figure 6:
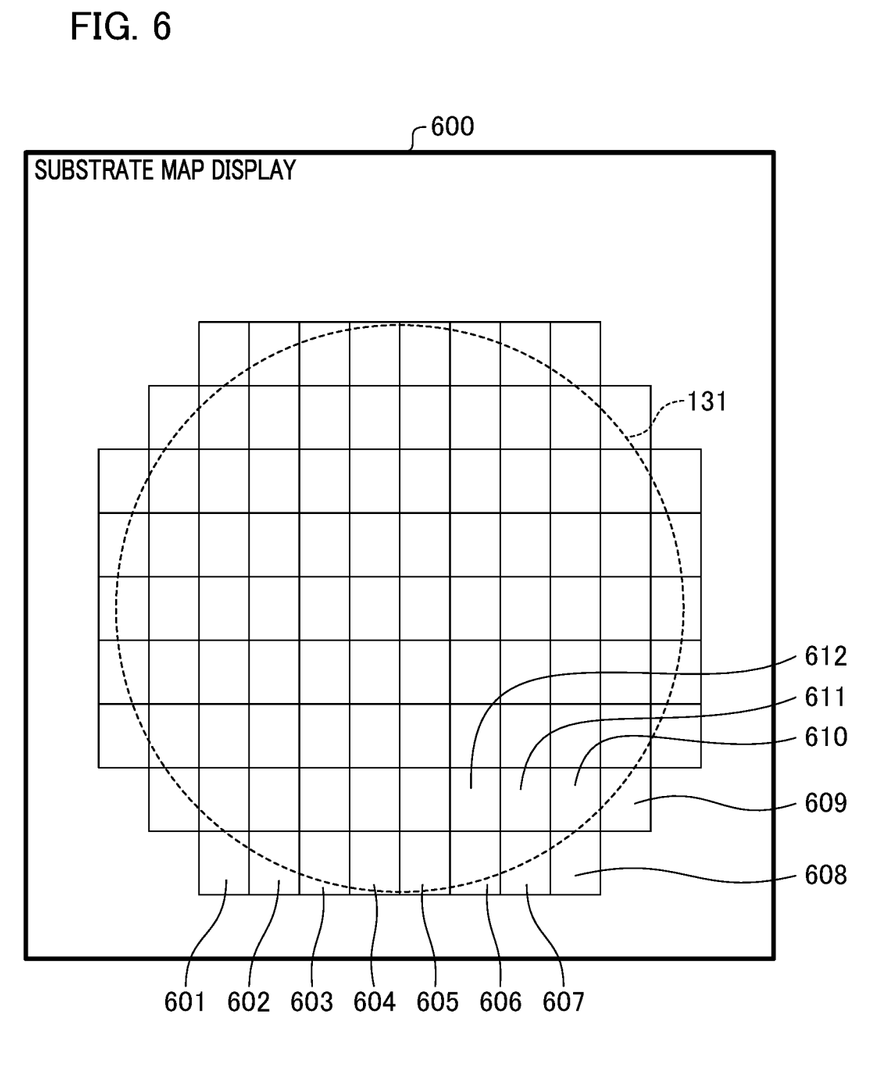
FIG. 6 is a diagram in which shot region layout information is displayed on a substrate map.

The setting of the shot region layout is displayed in a substrate map display as illustrated in FIG. 6. FIG. 6 is a diagram in which shot region layout information is displayed on a substrate map display. Reference numeral 600 represents a substrate map display displayed on the display screen of the display device, reference numeral 131 represents the outer circumferential part of the substrate 13, and reference numerals 601 to 612 represent shot regions, respectively.

Next, in step S502, the display control unit 401 causes information about setting of a chip layout within the shot region set in step S501 in the recipe setting of the imprinting device 204 to be displayed. The chip layout is the number of device chip regions present within the shot region or arrangement information.

As a specific example, in a case in which a rectangular shot region is formed of a plurality of rectangular chips, the chip layout includes the number of divided regions in the X axis and Y axis directions. As an example, in a case in which a total of six chips obtained by dividing a shot region into two in the X axis direction and three in the Y axis direction are disposed within one shot region, the layout is displayed as in FIG. 7.

Figure 7:
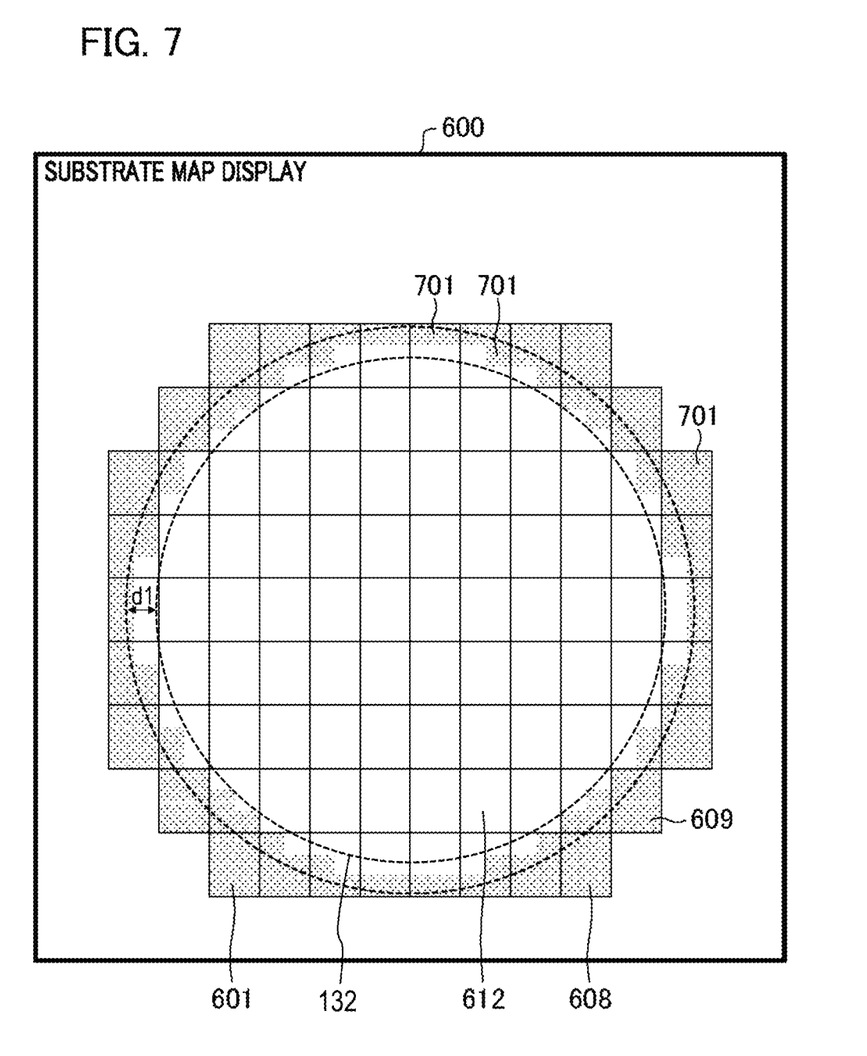
FIG. 7 is a diagram in which chip layout information is displayed on a substrate map.

FIG. 7 is a diagram in which chip layout information is displayed on a substrate map. In the present embodiment, ineffective chip regions 701 are displayed in gray within six chip regions in each shot region in imperfect shot regions of the outer circumferential part of the substrate based on shot layout information as illustrated in FIG. 7.

Further, in FIG. 7, six chip regions, for example, in a shot region 612 in the shot inner circumferential part 132 include no ineffective chip region 701, and the six chip regions are displayed all in white. Here, an effective chip refers to a chip located in a predetermined distance d1 or longer that is a margin from the outer circumference 131 of the substrate set taking warping of the substrate into account, and an ineffective chip refers to a chip located outside the predetermined distance d1.

As described above, step S502 functions as a display control step of causing positions of effective chips to be displayed in the shot region according to the number of chips included in each shot region. In addition, in step S502, the positions of ineffective chips are displayed for, for example, imperfect shot regions in the outer circumferential part of the substrate.

Next, in step S503, the display control unit 401 causes information about the die-by-die alignment mark among a plurality of die-by-die alignment marks present in the shot region to be used to be displayed for the recipe setting of the imprinting device 204.

In other words, the die-by-die alignment mark among the plurality of die-by-die alignment marks present in the shot region to be used is displayed to be superimposed on the shot region layout set in step S501 and the chip layout set in step S502.

The die-by-die alignment mark is automatically selected according to the shot region layout set in step S501 and the number of chips and positions of chips in the shot region set in step S502, and the like. Also with respect to the imperfect shot regions in the outer circumferential part of the substrate, the die-by-die alignment mark to be used at the time of alignment is tentatively and automatically selected from the relationship between the positions of the effective chip regions and the die-by-die alignment marks and displayed for each shot region.

In other words, step S503 functions as a selection step (by a selection unit) of automatically selecting an alignment mark to be used in alignment according to the positions of the effective chips in each shot region.

Further, when the alignment mark to be used in alignment is automatically selected, the number of alignment marks to be used in alignment corresponds to the number of cameras for alignment. In other words, since the number of cameras for alignment is four in the present embodiment, the number of alignment marks to be used in alignment is set to four.

In addition, in the present embodiment, the arrangement of alignment marks to be used in alignment is set to a substantial rectangular shape. The reason for this is to simplify drive for moving the cameras for alignment to align with the alignment marks.

Further, it is desirable to select the alignment marks to be used in alignment such that the amount of misalignment between the position of the center of gravity of the substantial rectangular shape and the position of the center of gravity of effective chips is smaller than or equal to a predetermined value. The operation is performed as described above because it can reduce errors in alignment.

Further, a user can change and select die-by-die alignment marks to be used in alignment in the present embodiment. Thus, in step S504, the display control unit 401 determines whether the user sets die-by-die alignment marks for each shot region.

In other words, it is determined whether the user has made a selection of a setting for each shot. If the user makes a setting for each shot, the process proceeds to step S505. Further, the selection is performed by using an input device for a computer such as a mouse, a keyboard, and a touch panel and a program for controlling the device.

In step S505, the display control unit 401 determines whether the user has selected any shot region on the substrate map display screen. In other words, it is determined whether the user has selected any shot region on the substrate map screen.

If a shot region is selected, the process proceeds to step S506. The shot region selection method is realized with the input device for a computer such as a mouse, a keyboard, and a touch panel and a program for controlling the device.

Figure 8A:
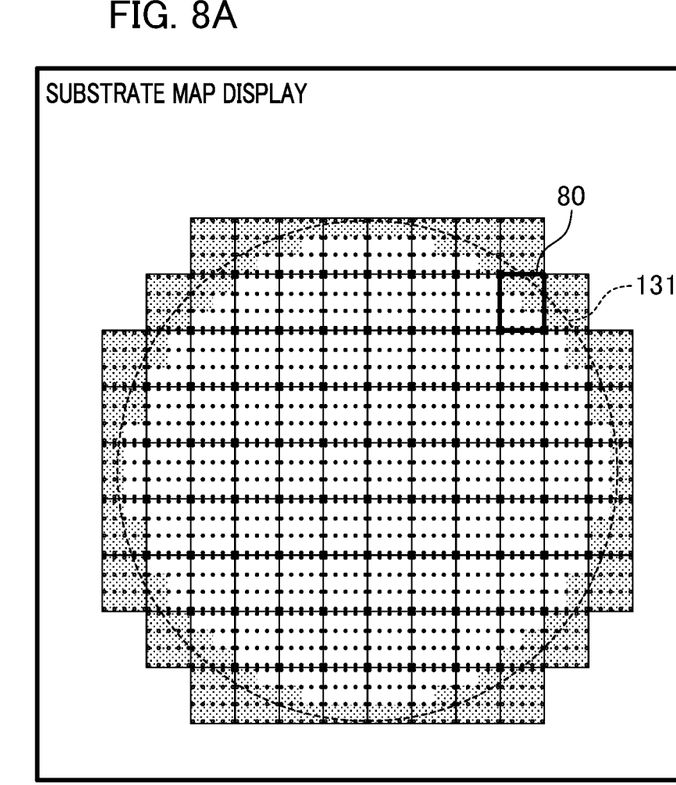
FIGS. 8A and 8B are diagrams in which die-by-die alignment marks and an effective chip region are superimposed on a shot region display to be displayed.

In step S506, the display control unit 401 causes the shot region display corresponding to the shot region selected in step S505 to be displayed as illustrated in FIG. 8A. FIG. 8A is a diagram in which die-by-die alignment marks and effective chip regions are displayed to be superimposed on each shot region display of the entire substrate, and reference numeral 80 represents a selected shot region.

As described above, the layout of the entire shot region on the substrate can be displayed and the positions of the alignment marks included in each shot region can be selectively displayed in the present embodiment. Further, although the alignment marks have been described as alignment marks for die-by-die alignment in the present embodiment, the alignment marks may be alignment marks for a global alignment.

Figure 8B:
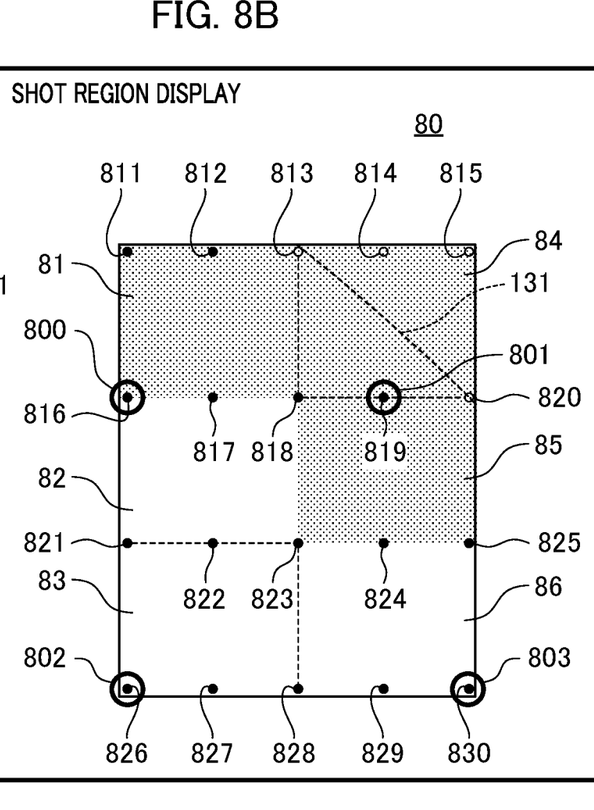

Next, in step S507, the display control unit 401 causes details of the shot region to be displayed as in FIG. 8B. FIG. 8B is a diagram illustrating a display example of die-by-die alignment marks and effective chip regions within the selected shot region 80.

In the shot region display of FIG. 8B, among six chip regions 81 to 86 of the selected shot region 80, the effective chip regions 82, 83 and 86 are displayed in white, and ineffective chip regions 81, 84, and 85 are displayed in gray.

Further, reference numerals 811 to 830 represent die-by-die alignment marks in FIG. 8B. In FIGS. 8A and 8B, die-by-die alignment marks located at a predetermined distance d2 or longer from an outer circumferential part 131 of the substrate are displayed in black circles as effective alignment marks.

On the other hand, die-by-die alignment marks 813, 814, 815, and 820 displayed in white circles are not located at the predetermined distance d2 or longer from the outer circumferential part 131 of the substrate, and thus the alignment marks are displayed as ineffective alignment marks.

In other words, in the present embodiment, positions of effective alignment marks in imperfect shot regions in the outer circumferential part of the substrate can be displayed, and alignment marks located at the predetermined distance d2 or longer from the outer circumference of the substrate are displayed as effective alignment marks.

Reference numerals 800 to 803 in FIG. 8B represent circular frames indicating alignment marks to be used in alignment. In FIG. 8B, the circular frames 800 to 803 are superimposed over die-by-die alignment marks 816, 819, 826, and 830 that are tentatively and automatically selected to be displayed. In other words, alignment marks to be used in alignment among alignment marks are differently displayed.

A user can select the die-by-die alignment marks to be used when die-by-die alignment is actually performed considering the positional relationship between the effective chip regions 82, 83, and 86 and the die-by-die alignment marks 800 to 803. In other words, the alignment marks to be used in alignment are selectable in accordance with an operation of the user.

The positions of the circular frames 800 to 803 are changed in accordance with positions of the die-by-die alignment marks selected (set) by the user.

In step S507, the alignment marks are set by acquiring the positions of the die-by-die alignment marks selected (set) by the user, and the flow for the recipe setting shown in FIG. 5 ends.

In the above-described embodiment, alignment is performed by using die-by-die alignment marks in the imprinting device as an example of a lithography apparatus. However, the lithography apparatus may be able to check effective chip regions in the exposure device.

In other words, the lithography apparatus (lithography system) of the present embodiment is not limited to an imprinting device that creates a pattern on the substrate side by pressing the pattern part of the mold against the imprint material on the substrate. For example, the device may be an exposure device that exposes the substrate to light by using the pattern part of an original plate (a mask or a reticle) to form the pattern on the substrate.

In addition, a pattern formation step of forming the pattern of the pattern part on the substrate by using the lithography system may be included. Further, an article can be manufactured by further including a developing step of developing the substrate on which the pattern has been formed in the pattern formation step of the lithography apparatus (lithography system) of the present embodiment.

In addition, in a case in which alignment in a global alignment method is performed instead of die-by-die alignment, effective chip regions are checked and global alignment marks can be selected. Thus, by performing a plurality of alignment measurement operations for one shot region, rotation errors and magnification errors of shots on the substrate can be measured, and thus such errors can be reduced.

In addition, an exposure device that performs exposure in the scan-and-repeat method may be adopted as the lithography apparatus. In other words, when a scanning region is set in an imperfect shot region in the outer circumferential part of a substrate on the exposure device that performs exposure in the scan-and-repeat method, an effective chip region can be checked. In this case, the effective chip corresponds to the scanning region in scan-and-repeat-type lithography.

Further, the position of an effective chip is displayed in a shot region according to the number of chips included in each shot region in the above description. However, without performing display, alignment marks to be used in alignment in each shot region may be automatically selected according to the number of chips included in the shot region.

In addition, a parameter adjustment unit that adjusts a parameter for lithography for each shot region according to the position of an effective chip included in the shot region may be provided.

In a case in which a parameter for lithography is adjusted for each chip, for example, it is useless to adjust the parameter for lithography for the position of an ineffective chip in the imperfect shot region in the outer circumferential part of the substrate. Thus, it is desirable to adjust a parameter for lithography only for the position of an effective chip included in each shot region.

Further, the adjustment of the parameter for lithography described above includes, for example, imprinting conditions, in addition to the automatic selection of alignment marks to be used in alignment in the case of the imprinting device, for example, as described above. The imprinting conditions include at least one of imprinting strength during imprinting, imprinting duration, a relative positional relationship between the mold and the substrate at each time in the imprinting sequence, deformation of the mold and the substrate, disposition of the imprint material, and the like.

In addition, in a case of a lithography apparatus, for example, a scanner, a stepper, or the like, the imprinting conditions are focus adjustment and exposure adjustment operations for chips, and the like. In other words, the throughput can be improved by skipping focus adjustment and exposure adjustment for ineffective chips, or the like.

Alternatively, it is desirable to automatically select alignment marks to be used in global alignment according to the positions of effective chips in the case of global alignment. In addition, it is desirable for a scan-and-repeat-type lithography apparatus to perform scanning while skipping the positions of ineffective chips. However, it is desirable in the above-described various automatic adjustments to enable the user to perform modification and change.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be supplied to the lithography information processing apparatus through a network or various storage media. Then, a computer (or a CPU, an MPU, or the like) of the lithography information processing apparatus may be configured to read and execute the program. In such a case, the program and the storage medium storing the program configure the present invention.

This application claims the benefit of Japanese Patent Application No. 2022-072579, filed on Apr. 26, 2022, which is hereby incorporated by reference herein in its entirety.

What is claimed is:

1. A lithography information processing apparatus comprising:
   at least one processor or circuit configured to function as a display control unit configured to cause a layout of a shot region of a substrate used in a lithography apparatus to be displayed and cause a position of an effective chip in each of a plurality of shot regions to be displayed according to the number of chips included in each of the shot regions,
   wherein the display control unit selectively displays a position of an effective alignment mark included in an imperfect shot region in an outer circumferential part of the substrate.

2. The lithography information processing apparatus according to claim 1, wherein the effective chips correspond to chips located at a predetermined distance or longer from an outer circumference of the substrate.

3. The lithography information processing apparatus according to claim 1, wherein the effective alignment mark corresponds to an alignment mark located at a predetermined distance or longer from the outer circumference of the substrate.

4. The lithography information processing apparatus according to claim 1, wherein the display control unit selectively displays the layout of all of the shot regions of the substrate.

5. The lithography information processing apparatus according to claim 1, wherein the alignment mark is an alignment mark for global alignment.

6. The lithography information processing apparatus according to claim 1, wherein the effective chip corresponds to a scanning region in scan-and-repeat-type lithography.

7. The lithography information processing apparatus according to claim 1,
   wherein the at least one processor or circuit is further configured to function as:
   a parameter adjustment unit configured to perform parameter adjustment for lithography for the effective chip in each of the shot regions.

8. The lithography information processing apparatus according to claim 7, wherein the parameter adjustment includes at least one of imprinting strength during imprinting, imprinting duration, a relative positional relationship between the mold and the substrate at each time in an imprinting sequence, deformation of the mold and the substrate, and disposition of an imprint material.

9. A lithography information processing apparatus comprising:
   at least one processor or circuit configured to function as a display control unit configured to cause a layout of a shot region of a substrate used in a lithography apparatus to be displayed and cause a position of an effective chip in each of a plurality of shot regions to be displayed according to the number of chips included in each of the shot regions,
   wherein the display control unit selectively displays positions of alignment marks included in each of the shot regions, and
   wherein the alignment mark corresponds to an alignment mark for die-by-die alignment.

10. The lithography information processing apparatus according to claim 9, wherein the display control unit differently displays the alignment mark to be used in alignment among the alignment marks.

11. The lithography information processing apparatus according to claim 10, wherein the alignment mark to be used in alignment is selectable according to an operation of a user.

12. The lithography information processing apparatus according to claim 10, wherein the number of alignment marks to be used in the alignment corresponds to the number of cameras for alignment.

13. The lithography information processing apparatus according to claim 12, wherein the alignment marks to be used in the alignment are disposed in a rectangular shape.

14. The lithography information processing apparatus according to claim 9, wherein the at least one processor or circuit is further configured to function as:
   a selection unit configured to automatically select the alignment mark to be used in alignment according to the position of the effective chip in each of the shot regions.

15. A lithography system comprising:
   at least one processor or circuit configured to function as a display control unit configured to cause a layout of a shot region of a substrate used in a lithography apparatus to be displayed and cause a position of an effective chip in each of a plurality of shot regions to be displayed according to the number of chips included in each of the shot regions, wherein the display control unit includes a selection unit configured to be capable of displaying a position of an alignment mark included in each of the shot regions and automatically select an alignment mark to be used in alignment according to the position of the effective chip in each of the shot regions, and a substrate drive unit configured to perform the alignment of the substrate with a pattern part for lithography by using the alignment mark selected by the selection unit.

16. A lithography information processing method comprising:

causing a layout of a shot region of a substrate used in a lithography apparatus to be displayed;

causing a position of an effective chip in each of a plurality of shot regions to be displayed according to the number of chips included in each of the shot regions; and causing a position of an effective alignment mark included in an imperfect shot region in an outer circumferential part of the substrate to be selectively displayed.

17. An article manufacturing method used by a lithography system including at least one processor or circuit configured to function as a display control unit configured to cause a layout of a shot region of a substrate used in a lithography apparatus to be displayed and cause a position of an effective chip in each of a plurality of shot regions to be displayed according to the number of chips included in each of the shot regions, the display control unit including a selection unit configured to be capable of displaying a position of an alignment mark included in each of the shot regions and automatically select an alignment mark to be used in alignment according to the position of the effective chip in each of the shot regions, and a substrate drive unit configured to perform the alignment of the substrate with a pattern part for lithography by using the alignment mark selected by the selection unit, the article manufacturing method comprising:

forming a pattern of the pattern part on the substrate; and developing the substrate on which the pattern is formed in the pattern forming step.

* * * * *